US011301387B2

(12) United States Patent
Takeuchi et al.

(10) Patent No.: US 11,301,387 B2
(45) Date of Patent: Apr. 12, 2022

(54) MEMORY SYSTEM CONFIGURED WITH A SYNTHESIZED LOGICAL BLOCK INTO WHICH A PLURALITY OF DATA UNITS FORMING AN ERROR CORRECTION FRAME ARE WRITTEN

(71) Applicant: KIOXIA Corporation, Tokyo (JP)

(72) Inventors: Hirokazu Takeuchi, Tokyo (JP);
Takahiro Miomo, Kanagawa (JP);
Hiroyuki Yamaguchi, Kanagawa (JP);
Hajime Yamazaki, Kanagawa (JP)

(73) Assignee: KIOXIA Corporation, Tokyo (JP)

( * ) Notice: Subject to any disclaimer, the term of this patent is extended or adjusted under 35 U.S.C. 154(b) by 152 days.

(21) Appl. No.: 16/704,555

(22) Filed: Dec. 5, 2019

(65) Prior Publication Data

US 2020/0110706 A1    Apr. 9, 2020

Related U.S. Application Data

(62) Division of application No. 15/876,792, filed on Jan. 22, 2018, now abandoned.

(30) Foreign Application Priority Data

Mar. 24, 2017 (JP) .............................. JP2017-059072

(51) Int. Cl.
*G11C 29/52* (2006.01)
*G06F 12/0862* (2016.01)
(Continued)

(52) U.S. Cl.
CPC ...... *G06F 12/0862* (2013.01); *G06F 11/1068* (2013.01); *G06F 12/0607* (2013.01);
(Continued)

(58) Field of Classification Search
CPC .. G06F 12/0862; G06F 11/1068; G06F 12/10; G06F 2212/657; G06F 2212/1024;
(Continued)

(56) References Cited

U.S. PATENT DOCUMENTS 7,525,842 B2    4/2009 Nguyen et al.
9,081,661 B2    7/2015 Unesaki et al.
(Continued)

FOREIGN PATENT DOCUMENTS

JP    2012064158 A    3/2012
JP    5982148 B2    8/2016

*Primary Examiner* — Tasnima Matin
(74) *Attorney, Agent, or Firm* — Kim & Stewart LLP

(57) ABSTRACT

A memory system includes a memory and a memory controller. The memory includes first and second parallel operation elements, each including a plurality of first and second storage regions, respectively, and first and second buffers, respectively. The memory controller performs operations on the memory based on first and second group information. The first group information defines first groups, each first group including one first storage region and one second storage region, and each second group including at least two first groups. The memory controller, in response to a host command targeting a first storage region, (i) acquires first data from the first buffer, and thereafter (ii) causes the memory to read out second data to the first buffer. The first storage region storing the first data and the second storage region storing the second data belong to different first groups and to the same second group.

20 Claims, 14 Drawing Sheets

(51) Int. Cl.
*G06F 11/10* (2006.01)
*G06F 12/10* (2016.01)
*G11C 29/00* (2006.01)
*G06F 12/06* (2006.01)
*G06F 12/0868* (2016.01)
*H03M 13/15* (2006.01)
*G11C 29/04* (2006.01)
*G11C 29/44* (2006.01)
*H03M 13/27* (2006.01)

(52) U.S. Cl.
CPC .......... *G06F 12/0868* (2013.01); *G06F 12/10* (2013.01); *G11C 29/76* (2013.01); *G06F 2212/1024* (2013.01); *G06F 2212/313* (2013.01); *G06F 2212/6022* (2013.01); *G06F 2212/6026* (2013.01); *G06F 2212/657* (2013.01); *G06F 2212/7201* (2013.01); *G06F 2212/7203* (2013.01); *G06F 2212/7208* (2013.01); *G11C 29/44* (2013.01); *G11C 29/52* (2013.01); *G11C 2029/0411* (2013.01); *H03M 13/1515* (2013.01); *H03M 13/27* (2013.01)

(58) Field of Classification Search
CPC . G11C 29/76; G11C 29/44; G11C 2029/0411; G11C 29/52; H03M 13/27; H03M 13/1515
See application file for complete search history.

(56) References Cited

U.S. PATENT DOCUMENTS

| | | |
|---|---|---|
| 2008/0147968 A1 | 6/2008 | Lee et al. |
| 2010/0115206 A1 | 5/2010 | de la Iglesia et al. |
| 2011/0302361 A1* | 12/2011 | Yamazaki ............ G11C 16/349 711/103 |
| 2012/0159072 A1 | 6/2012 | Hida et al. |
| 2013/0166824 A1 | 6/2013 | Shim et al. |
| 2016/0034406 A1* | 2/2016 | Hansson ............. G06F 13/1673 711/105 |
| 2017/0147503 A1* | 5/2017 | de Silva ................ G06F 3/0652 |
| 2017/0185472 A1* | 6/2017 | Kathawala .......... G06F 11/0727 |
| 2017/0315908 A1* | 11/2017 | Yang ..................... G11C 16/10 |
| 2018/0276129 A1 | 9/2018 | Takeuchi et al. |

\* cited by examiner

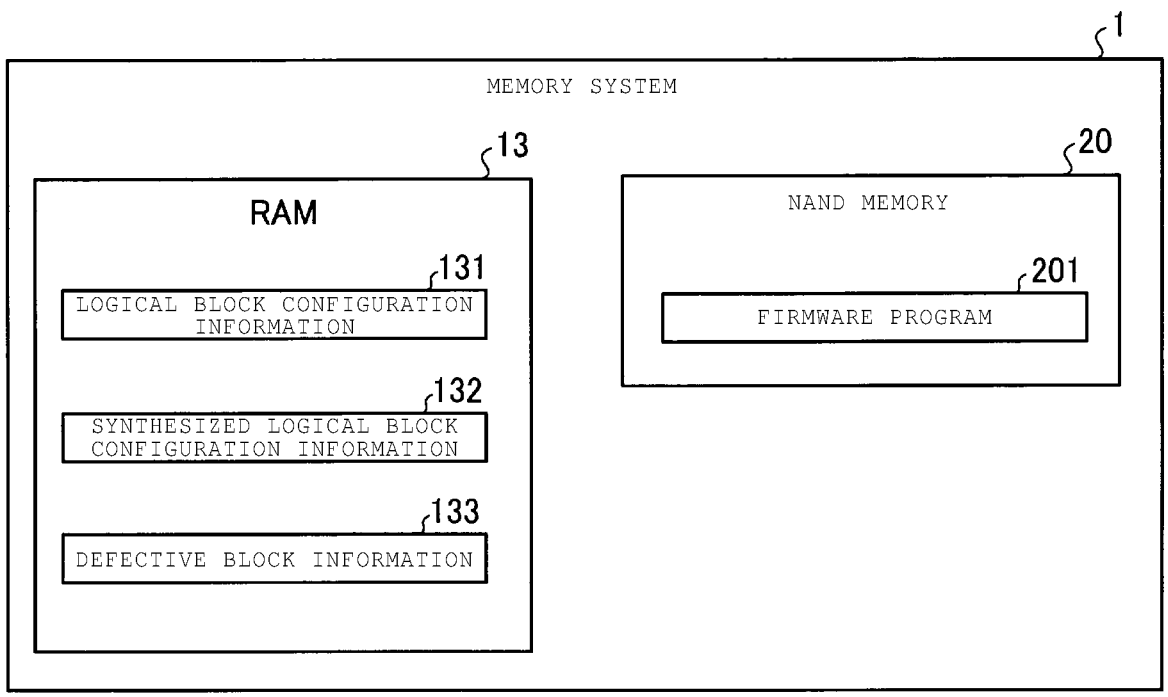

MEMORY SYSTEM CONFIGURED WITH A SYNTHESIZED LOGICAL BLOCK INTO WHICH A PLURALITY OF DATA UNITS FORMING AN ERROR CORRECTION FRAME ARE WRITTEN

CROSS-REFERENCE TO RELATED APPLICATION

This application is a divisional of U.S. patent application Ser. No. 15/876,792, filed Jan. 22, 2018, which application is based upon and claims the benefit of priority from Japanese Patent Application No. 2017-059072, filed Mar. 24, 2017, the entire contents of which are incorporated herein by reference.

FIELD

Embodiments described herein relate generally to a memory system.

BACKGROUND

A memory system mounted with non-volatile memory cell array has become popular as an external storage device used in a computer system. In addition, when reading out data from the non-volatile memory cell array in response to a request by a host, there is a technique for prefetching data, which is expected to be subsequently requested by the host, from the non-volatile memory cell array.

DESCRIPTION OF THE DRAWINGS

FIG. 8 is a diagram illustrating various pieces of information stored in the memory system according to the first embodiment.

FIG. 9 is a diagram illustrating an example of a data structure in which logical block configuration information is stored, according to the first embodiment.

DETAILED DESCRIPTION

Embodiments provide a memory system having improved prefetching efficiency.

In general, according to one embodiment, a memory system is capable of being connected to a host. The memory system includes a memory and a memory controller. The memory includes first and second parallel operation elements, the first parallel operation element including a non-volatile memory cell array having a plurality of first storage regions and a first buffer and the second parallel operation element including a non-volatile memory cell array having a plurality of second storage regions and a second buffer. The memory controller is configured to perform operations on the memory based on first group information and second group information that, the first group information defining one or more first groups, each of the first groups including one of the first physical blocks and one of the second storage regions and each of the second groups including at least two of the first groups. The memory controller, in response to a command from the host targeting one of the first storage regions, (i) acquires first data, which is data targeted by the command, from the first buffer, and thereafter (ii) causes the memory to read out second data to the first buffer. The first storage region in which the first data is stored and the second storage region in which the second data is stored belong to different first groups and to the same second group.

Hereinafter, memory systems according to embodiments will be described in detail with reference to the accompanying drawings. It should be understood that the present disclosure is not limited to these embodiments.

First Embodiment

Figure 1:
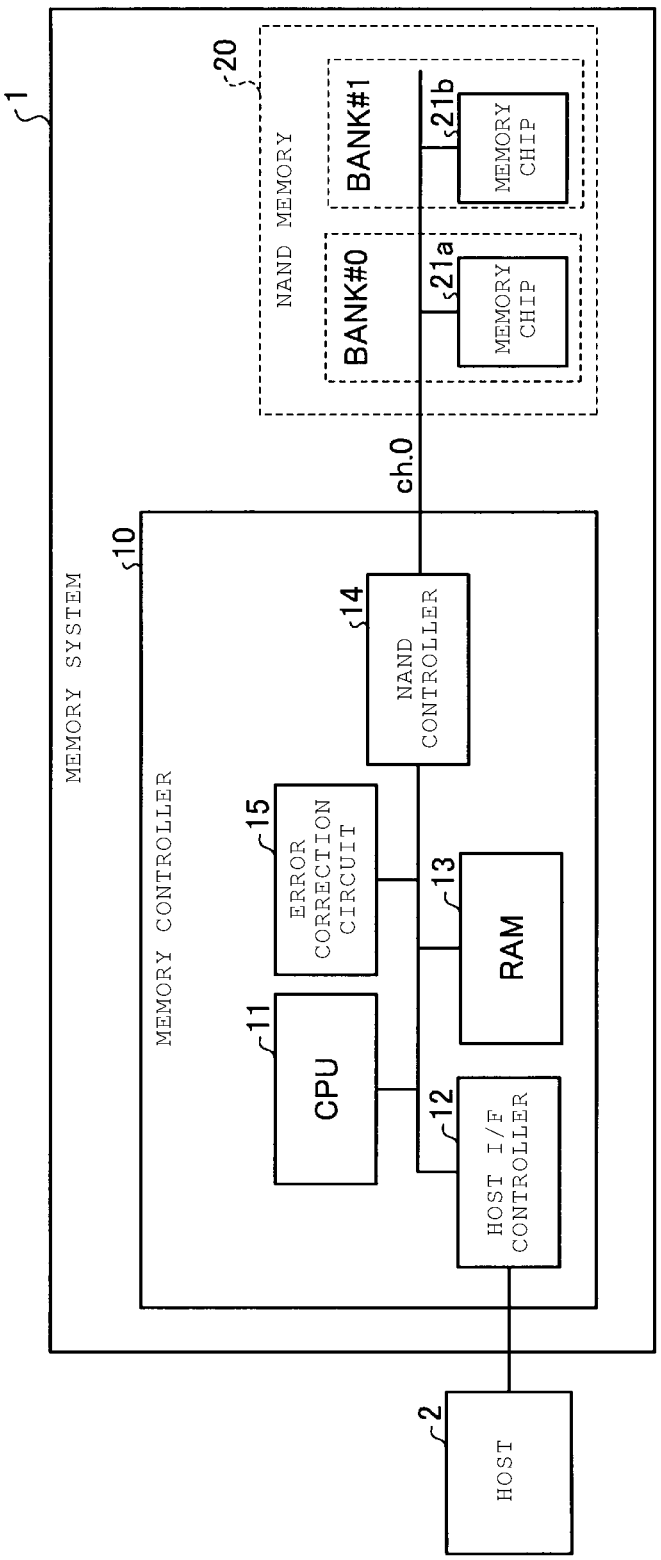
FIG. 1 is a diagram illustrating an example of a configuration of a memory system according to a first embodiment.

FIG. 1 is a diagram illustrating an example of a configuration of a memory system according to a first embodiment. A memory system 1 is connected to a host 2 by a predetermined communication interface. The host 2 may be, for example, a personal computer, a portable information terminal, a server, or the like. The memory system 1 can receive access requests (e.g., a read request and a write request) from the host 2. Each of the access requests includes a logical address indicating an access destination. The logical address indicates a location in a logical address space which is provided to the host 2 from the memory system 1. The memory system 1 receives data to be written, together with the write request.

The memory system 1 includes a memory controller 10 and a NAND flash memory (NAND memory, for short) 20. The memory controller 10 executes data transmission between the host 2 and the NAND memory 20. Meanwhile, the memory system 1 may include any non-volatile memory instead of the NAND memory 20. For example, the memory system 1 may include a NOR flash memory instead of the NAND memory 20.

The memory controller 10 includes a central processing unit (CPU) 11, a host interface (I/F) controller 12, a random access memory (RAM) 13, a NAND controller 14, and an error correction circuit 15.

The CPU 11 controls the memory controller 10 based on a firmware program (e.g., a firmware program 201 to be described later). The firmware program 201 is stored in the NAND memory 20 in advance, is read out from the NAND memory 20 during the start-up of the memory system, and is executed by the CPU 11. Meanwhile, a location where the firmware program 201 is stored is not limited to the NAND memory 20.

The RAM 13 is a volatile memory that provides a temporary storage region for the CPU 11. The type of memory constituting the RAM 13 is not limited to a specific type. For example, the RAM 13 may be configured with a dynamic random access memory (DRAM), a static random access memory (SRAM), or a combination thereof.

The host I/F controller 12 controls a communication interface between the host I/F controller and the host 2. The NAND controller 14 accesses the NAND memory 20 under the control of the CPU 11. The CPU 11 controls the host I/F controller 12 and the NAND controller 14 to achieve data transmission between the host 2 and the NAND memory 20.

The error correction circuit 15 performs encoding for error correction on data written into the NAND memory 20 and decoding of the encoded data which is read from the NAND memory 20, to execute error correction on the data. Any algorithm can be adopted for encoding that is performed in the error correction circuit 15. In one example, the error correction circuit 15 performs encoding using Reed-Solomon (RS) coding. The error correction circuit 15 may include a circuit for encoding and a circuit for decoding. A frame for error correction will be described later.

The NAND memory 20 includes one or more memory chips 21. Here, as an example, the NAND memory 20 includes two memory chips 21a and 21b.

Figure 2:
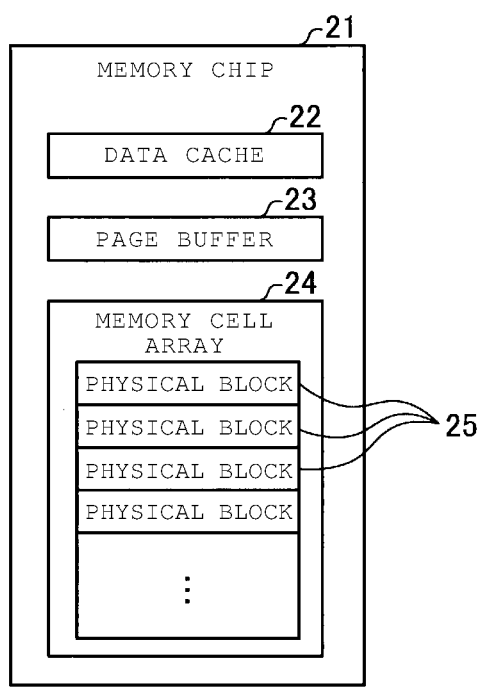
FIG. 2 is a diagram illustrating an example of a configuration of one memory chip according to the first embodiment.

FIG. 2 is a diagram illustrating an example of a configuration of one memory chip 21. The memory chip 21 includes a data cache 22, a page buffer 23, and a memory cell array 24. The memory cell array 24 is a non-volatile memory cell array, and is configured such that a plurality of memory cells is arranged in a matrix configuration.

Figure 3:
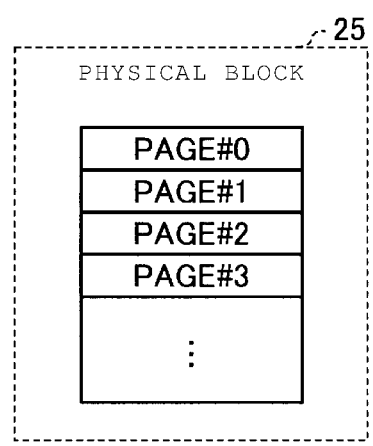
FIG. 3 is a diagram illustrating an example of a configuration of one physical block according to the first embodiment.

The memory cell array 24 includes a plurality of physical blocks 25. The physical block 25 is a storage region in the memory cell array 24 and is a minimum unit of data erasure. The physical block 25 includes a plurality of pages as illustrated in FIG. 3. The page is a storage region in the physical block 25 and is a minimum unit of reading data and writing data. Each of the physical blocks 25 is identified by a physical block number.

The data cache 22 and the page buffer 23 are memories that are used as buffers. In the data cache 22, data transmitted to or received from the memory controller 10 is buffered. In the page buffer 23, data written in or read out from the memory cell array 24 is buffered.

As an example, the data cache 22 and the page buffer 23 can hold pieces of data each having a size of one page. Each of the data cache 22 and the page buffer 23 can be configured with any type of memory. The data cache 22 and the page buffer 23 can be configured with, for example, an SRAM.

Referring back to FIG. 1, the two memory chips 21 included in the NAND memory 20 are connected to the memory controller 10 through one channel (ch.0). The channel is a wiring group including a signal line for communicating data, an address, and a command.

The two memory chips 21 constitute different banks, respectively. That is, in this example, the NAND memory 20 includes two banks. The banks are identified by respective bank numbers (BANK #0, BANK #1). Hereinafter, each bank can be denoted by a bank number. That is, a bank having a bank number of BANK #0 is denoted by BANK #0, and a bank having a bank number of BANK #1 is denoted by BANK #1.

The memory controller 10 can be operated in a bank interleaving system. The bank interleaving is a method in which the memory controller 10 transmits and receives data or a command to and from a memory chip belonging to one bank (for example, the memory chip 21b) while a memory chip belonging to another bank (for example, the memory chip 21a) has access to the memory cell array 24. Since the memory chips 21 of the respective banks share a channel, the memory controller 10 cannot simultaneously transmit and receive data, an address, and a command to and from two memory chips 21 belonging to different banks connected to the same channel, but can simultaneously operate the two banks by bank interleaving. That is, the bank interleaving is one of the parallel operation methods, and the plurality of memory chips 21 (here, the memory chips 21a and 21b) belonging to different banks respectively correspond to parallel operation elements.

In the bank interleaving, a bank which is an access destination is selected based on a chip enable (CE) signal, as an example. That is, the memory chip 21a belonging to BANK #0 and the memory chip 21b belonging to BANK #1 are connected to the memory controller 10 through independent CE signal lines. The memory controller 10 can select one of the memory chips 21a and 21b based on the CE signal while the other memory chip is accessing the memory cell array 24, and transmits and receives a command, an address, or data to and from the selected memory chip 21 through an I/O signal line. Meanwhile, a method of selecting a bank which is an access destination is not limited to a method using a CE signal.

In this manner, the memory controller 10 can perform the parallel operation of the two memory chips 21a and 21b belonging to different banks by the bank interleaving. Here, the memory controller 10 constructs one logical block by the plurality of physical blocks 25 to be accessed in parallel.

Figure 4:
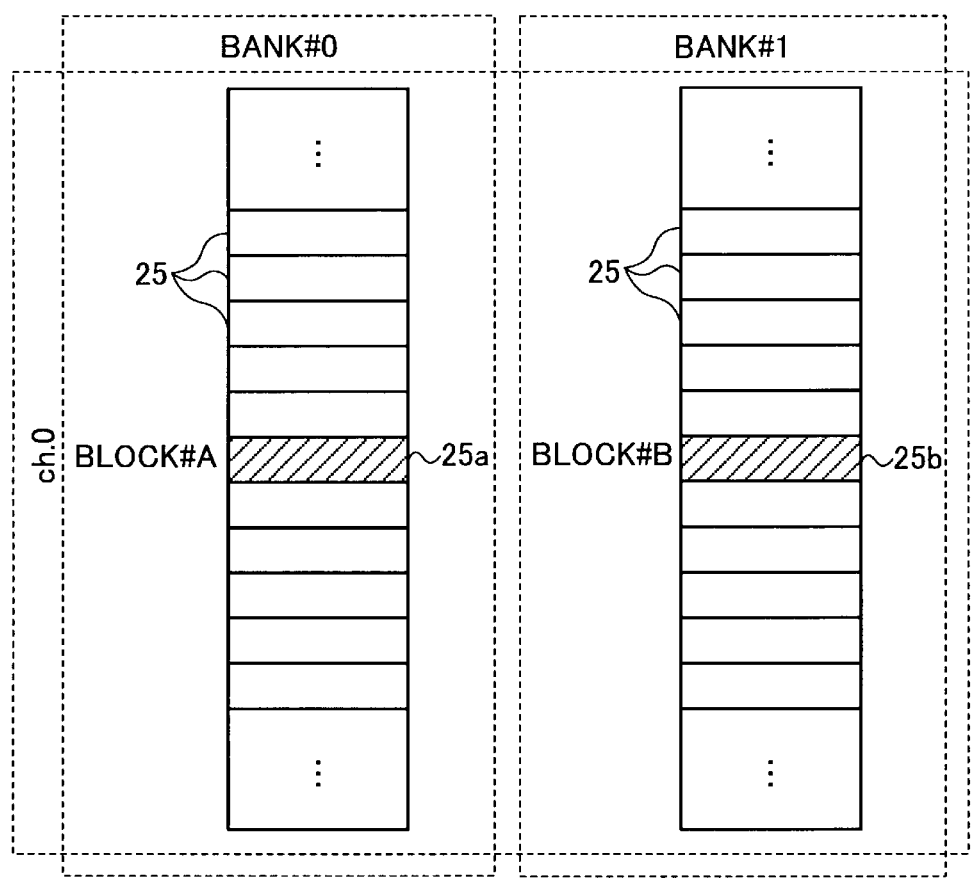
FIG. 4 is a diagram illustrating an example of a configuration of one logical block according to the first embodiment.

FIG. 4 is a diagram illustrating an example of a configuration of one logical block. Two hatched physical blocks 25 (that is, a physical block 25a having a block number of BLOCK #A and a physical block 25b having a block number of BLOCK #B) which belong to different banks constitute one logical block. Although only one logical block is illustrated in this drawing, the NAND memory 20 includes a plurality of logical blocks, and each of the plurality of logical blocks includes two physical blocks 25 belonging to different banks. One physical block 25 does not belong to two or more logical blocks. Each of the logical blocks is identified by a logical block number.

Hereinafter, each physical block 25 can be denoted by a physical block number, similar to a case of a bank.

Further, the memory controller 10 constructs one synthesized logical block by a plurality of logical blocks.

Figure 5:
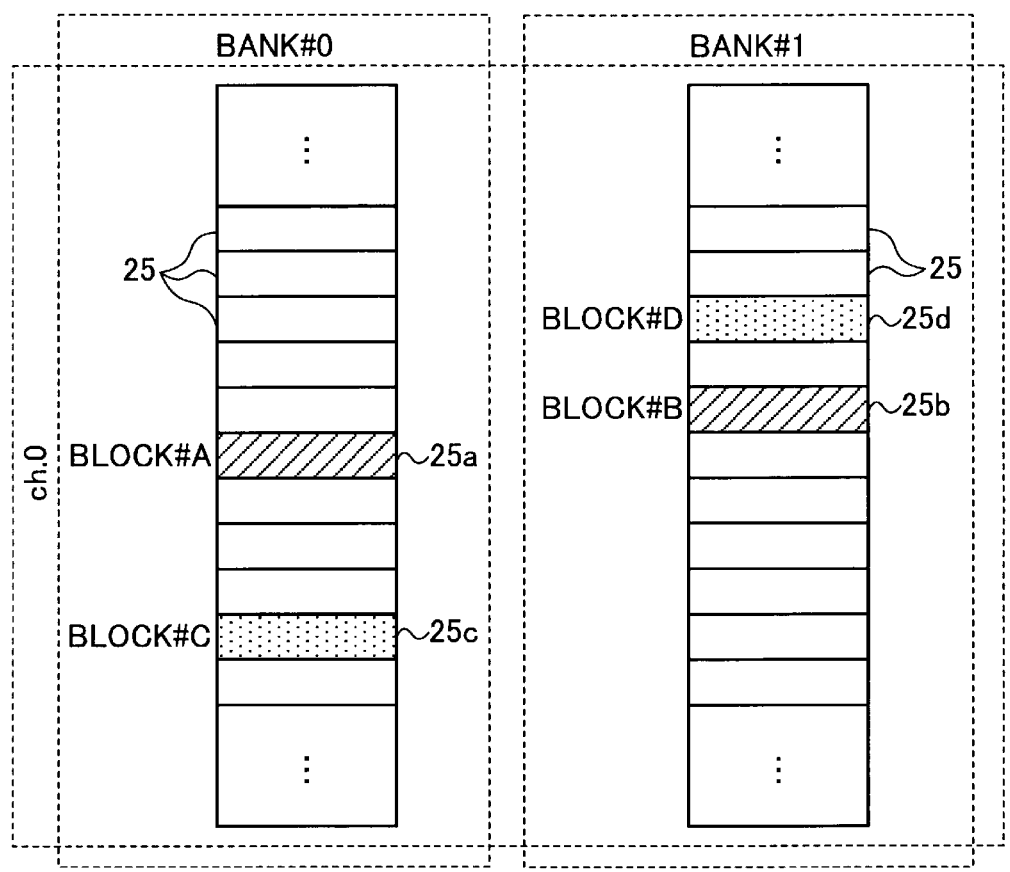
FIG. 5 is a diagram illustrating an example of a configuration of one synthesized logical block according to the first embodiment.

FIG. 5 is a diagram illustrating an example of a configuration of one synthesized logical block. A logical block including two hatched physical blocks 25a and 25b and a logical block including two dot-hatched physical blocks (namely, a physical block 25c having a block number of BLOCK #C and a physical block 25d having a block number of BLOCK #D) constitute one synthesized logical block. Although only one synthesized logical block is illustrated in this drawing, the NAND memory 20 may include a plurality of synthesized logical blocks. One logical block does not belong to two or more synthesized logical blocks. Each of the synthesized logical blocks is identified by a synthesized block ID.

Hereinafter, the number of physical blocks 25 constituting one logical block will be denoted by N1. In addition, the number of logical blocks constituting one synthesized logical block will be denoted by N2. The number of physical blocks 25 constituting one synthesized logical block corresponds to N1*N2. According to the example of FIG. 5, N1 is "2", and N2 is "2".

In the exemplary embodiment of the present disclosure, the memory controller 10 constructs a frame for error correction by the error correction circuit 15 by data of N1*N2 pages. The memory controller 10 writes pieces of data of each page constituting one frame into different physical blocks 25 among N1*N2 physical blocks 25 constituting the same synthesized logical block.

Figure 6:
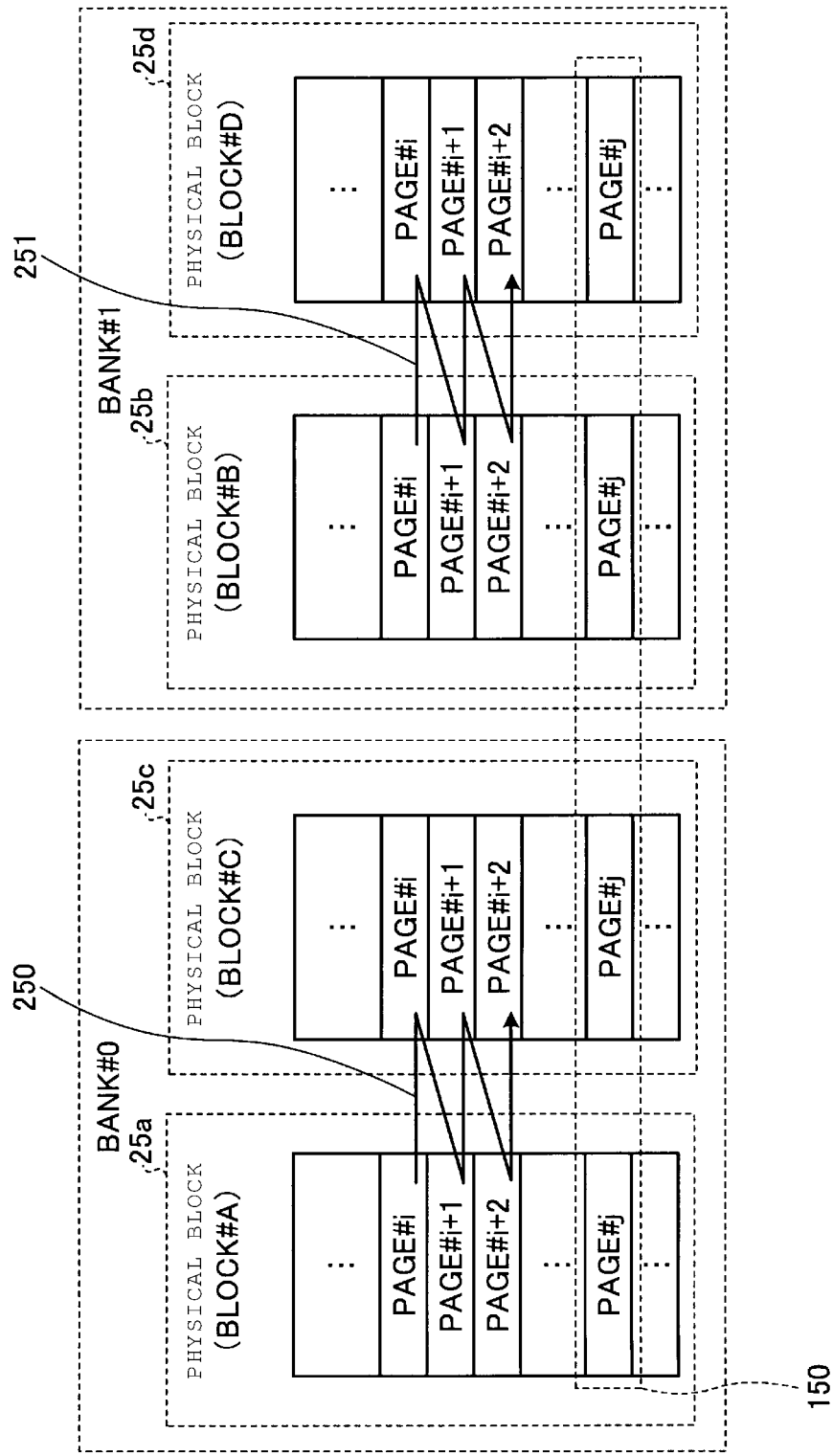
FIG. 6 is a diagram illustrating an example of the order of access to a NAND memory and a configuration example of a frame in the memory system according to the first embodiment.

FIG. 6 is a diagram illustrating an example of the order of access to the NAND memory 20 and a configuration example of a frame. As illustrated in this drawing, among four physical blocks 25 (BLOCK #A, BLOCK #B, BLOCK #C, and BLOCK #D) constituting the same synthesized logical block, access is executed on the memory chip 21*a* of BANK #0 in order of PAGE #i of BLOCK #A, PAGE #i of BLOCK #C, PAGE #i+1 of BLOCK #A, and PAGE #i+1 of BLOCK #C as indicated by an arrow 250. Similarly, access is executed on the memory chip 21*b* of BANK #1 in order of PAGE #i of BLOCK #B, PAGE #i of BLOCK #D, PAGE #i+1 of BLOCK #B, and PAGE #i+1 of BLOCK #D as indicated by an arrow 251. The access to the memory chip 21*a* of BANK #0 and the access to the memory chip 21*b* of BANK #1 are executed in parallel by bank interleaving, and thus the access to the NAND memory 20 is executed in order of PAGE #i of BLOCK #A, PAGE #i of BLOCK #B, PAGE #i of BLOCK #C, PAGE #i of BLOCK #D, PAGE #i+1 of BLOCK #A, PAGE #i+1 of BLOCK #B, PAGE #i+1 of BLOCK #C, and PAGE #i+1 of BLOCK #D.

As an example, one frame has N1*N2 pages to be continuously accessed. That is, in the example of FIG. 6, one frame has four pieces of data written in the same page number of different physical blocks 25, as denoted by reference numeral 150.

Meanwhile, one frame includes a parity for error correction by the error correction circuit 15. In this embodiment, one frame has pieces of data of N1*N2 pages, and thus it is possible to increase the size of the frame as compared to a case where one frame has pieces of data of N1 pages written in different physical blocks 25 constituting one logical block. Accordingly, it is possible to reduce a ratio of the size of a parity to the size of a frame and to efficiently store data transmitted from the host 2 in the NAND memory 20.

The memory controller 10 can execute prefetching on the NAND memory 20.

Specifically, the memory controller 10 acquires one piece of data (for example, data in PAGE #i of BLOCK #A illustrated in FIG. 6) which is stored in a memory chip belonging to a certain bank (for example, the memory chip 21*a*) in a case where the host 2 requests the read-out of the data, and prefetches another piece of data (for example, data in PAGE #i of BLOCK #C illustrated in FIG. 6) which is to be read subsequently, to the page buffer 23 from the memory cell array 24 before the read-out of said another piece of data is requested.

In many cases, data read out by sequential reading have been written according to an access pattern of sequential writing requested by the host 2. The sequential reading refers to an access pattern in which a plurality of pieces of data are read out from the memory system 1 in order of logical addresses with respect to a range in which the logical addresses are continuous with each other. The sequential writing refers to an access pattern in which a plurality of pieces of data are written in the memory system 1 in order of logical addresses with respect to a range in which the logical addresses are continuous with each other.

Accordingly, in a case where the pattern requested by the host 2 corresponds to sequential reading, there is a high possibility that the read-out of the other piece of data is requested after the one piece of data. On the other hand, data is read out to the page buffer 23 from the memory cell array 24 for a relatively long period of time. In a case where the read-out of said another piece of data is requested after the one piece of data when the prefetching of said another piece of data has been performed, the memory controller 10 can acquire said another piece of data without requiring access to the memory cell array 24, and thus the speed of a response to a read request from the host 2 is improved.

Figure 7:
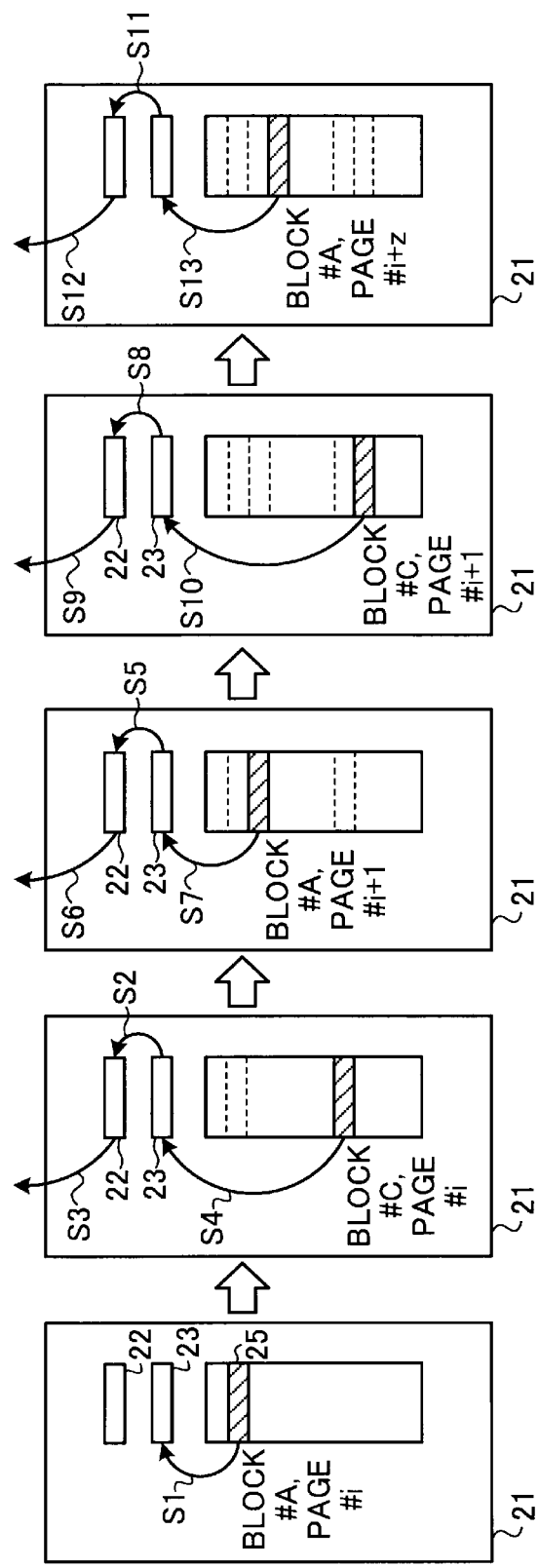
FIG. 7 is a diagram illustrating an outline of a prefetching operation according to the first embodiment.

FIG. 7 is a diagram illustrating an outline of a prefetching operation. In a case where the memory controller 10 receives a request for reading data stored in PAGE #i of BLOCK #A of the memory chip 21 of BANK #0, the memory controller causes the memory chip 21 of BANK #0 to read out the data stored in PAGE #i of BLOCK #A to the page buffer 23 (S1). The memory controller 10 causes the memory chip 21 of BANK #0 to transmit the data from the page buffer 23 to the data cache 22 (S2) and then to output the data from the data cache 22 to the memory controller 10 (S3).

Subsequently, the memory controller 10 specifies BLOCK #C, which is included in the memory chip 21 of BANK #0 and belongs to the same synthesized logical block as BLOCK #A and which is the physical block 25 in which data to be read subsequently to BLOCK #A in the memory chip 21 of BANK #0, as a physical block 25 to be prefetched by referring to synthesized logical block configuration information 132, which will be described later with reference to FIG. 10. The memory controller 10 causes the memory chip 21 of BANK #0 to read out the data stored in PAGE #i of BLOCK #C to the page buffer 23 (S4).

Thereafter, in a case where the memory controller 10 receives a request for reading the data stored in PAGE #i of BLOCK #C, the memory controller causes the memory chip 21 of BANK #0 to transmit the data from the page buffer 23 to the data cache 22 (S5). The memory controller 10 causes the memory chip 21 of BANK #0 to output the data from the data cache 22 to the memory controller 10 (S6).

Hereinafter, the memory system 1 repeatedly performs the same processes as S4 to S6 while switching the physical blocks 25 to be prefetched in order indicated by the arrow 250 of FIG. 6 in S7 to S12.

For example, after S6, the memory controller 10 specifies BLOCK #A, which is included in the memory chip 21 of BANK #0 and belongs to the same synthesized logical block as BLOCK #C and which is the physical block 25 in which data to be read subsequently to BLOCK #C is written in the memory chip 21 of BANK #0, as a physical block 25 to be prefetched. The memory controller 10 causes the memory chip 21 of BANK #0 to read out data stored in PAGE #i+1 of BLOCK #A to the page buffer 23 (S7).

Thereafter, in a case where the memory controller 10 receives a request for reading the data stored in PAGE #i+1 of BLOCK #A, the memory controller causes the memory chip 21 of BANK #0 to transmit the data from the page buffer 23 to the data cache 22 (S8). The memory controller 10 causes the memory chip 21 of BANK #0 to output the data from the data cache 22 to the memory controller 10 (S9).

In this manner, the physical blocks 25 to be prefetched are sequentially specified in order indicated by the arrow 250 of FIG. 6 with respect to the memory chip 21 of BANK #0. Similarly, the physical blocks 25 to be prefetched are sequentially specified in order indicated by the arrow 251 of FIG. 6 with respect to the memory chip 21 of BANK #1.

FIG. 8 is a diagram illustrating various pieces of information stored in the memory system 1.

In the NAND memory 20, data transmitted from the host 2 is stored, and the firmware program 201 is stored in advance.

Logical block configuration information 131, synthesized logical block configuration information 132, and defective block information 133 are stored in the RAM 13. The pieces of information in the RAM 13 are saved in the NAND memory 20, for example, when the power supply of the memory system 1 is turned off, and are loaded to the RAM 13 from the NAND memory 20 when the power supply of the memory system 1 is turned on.

The logical block configuration information 131 is information indicating the plurality of physical blocks 25 constituting each logical block. In addition, the synthesized logical block configuration information 132 is information indicating a plurality of logical blocks constituting each synthesized logical block and the order of access to the plurality of logical blocks constituting each synthesized logical block.

FIG. 9 is a diagram illustrating an example of a data structure in which the logical block configuration information 131 is stored. The logical block configuration information 131 is stored in a table format in which a plurality of physical blocks is associated with each logical block.

Figure 10:
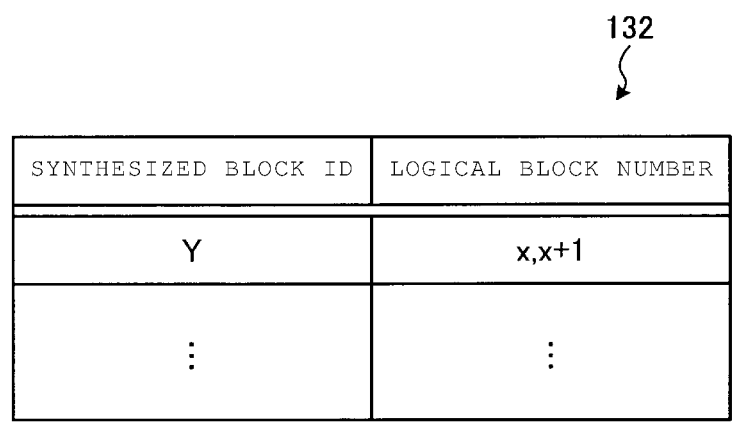
FIG. 10 is a diagram illustrating an example of a data structure in which synthesized logical block configuration information is stored, according to the first embodiment.

FIG. 10 is a diagram illustrating an example of a data structure in which the synthesized logical block configuration information 132 is stored. The synthesized logical block configuration information 132 is stored in a table format in which a plurality of logical blocks is associated with each synthesized logical block. In a field in which logical block numbers of the plurality of logical blocks are written, the logical block numbers are arrayed in order corresponding to the order of access of data. The memory controller 10 determines that a logical block number recorded at the end of the field is followed by a logical block number recorded at the head of the same field.

According to the example of FIG. 10, a synthesized logical block having a synthesized block ID "Y" has a logical block having a logical block number "X" and a logical block having a logical block number "X+1". Regarding the synthesized logical block, the logical block having the logical block number "X" is accessed, and then the logical block having the logical block number "X+1" is accessed. Thereafter, the logical block having the logical block number "X" is again accessed.

In addition, according to the example of FIG. 9, the logical block having the logical block number "X" has BLOCK #A and BLOCK #B. In addition, the logical block having the logical block number "X+1" has BLOCK #C and BLOCK #D.

The memory controller 10 can specify that access to BANK #0 is performed in order of BLOCK #A, BLOCK #C, BLOCK #A, and BLOCK #C (that is, the order indicated by the arrow 250 of FIG. 6) by referring to the logical block configuration information 131 of FIG. 9 and the synthesized logical block configuration information 132 of FIG. 10. In addition, the memory controller 10 can specify that access to BANK #1 is performed in order of BLOCK #B, BLOCK #D, BLOCK #B, and BLOCK #D (that is, the order indicated by the arrow 251 of FIG. 6).

The memory controller 10 specifies the physical block 25 to be prefetched based on the order of access, by referring to the logical block configuration information 131 and the synthesized logical block configuration information 132.

Meanwhile, data configurations of the logical block configuration information 131 and the synthesized logical block configuration information 132 are not limited to the examples of the data structures illustrated in FIGS. 9 and 10. The logical block configuration information 131 may have any data configuration as long as the plurality of physical blocks 25 constituting each logical block can be designated. In addition, the synthesized logical block configuration information 132 may have any data configuration as long as a plurality of logical blocks constituting each synthesized logical block and the order of access to the plurality of logical blocks can be designated. Information as to the plurality of logical blocks constituting each synthesized logical block and information as to the order of access to the plurality of logical blocks included in each synthesized logical block may be configured separately from each other.

Figure 11:
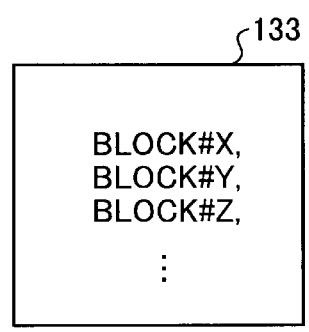
FIG. 11 is a diagram illustrating an example of a data structure in which defective block information is stored, according to the first embodiment.

The defective block information 133 is information for specifying a defective block. The defective block is a block determined to be unusable due to a failure of a circuit. FIG. 11 is a diagram illustrating an example of a data structure in which the defective block information 133 is stored. As illustrated in this drawing, the defective block information 133 is stored as a list containing physical block numbers of defective blocks. Meanwhile, the data configuration of the defective block information 133 is not limited thereto. In addition, whether being a defective block may be determined in units of logical blocks.

Figure 12:
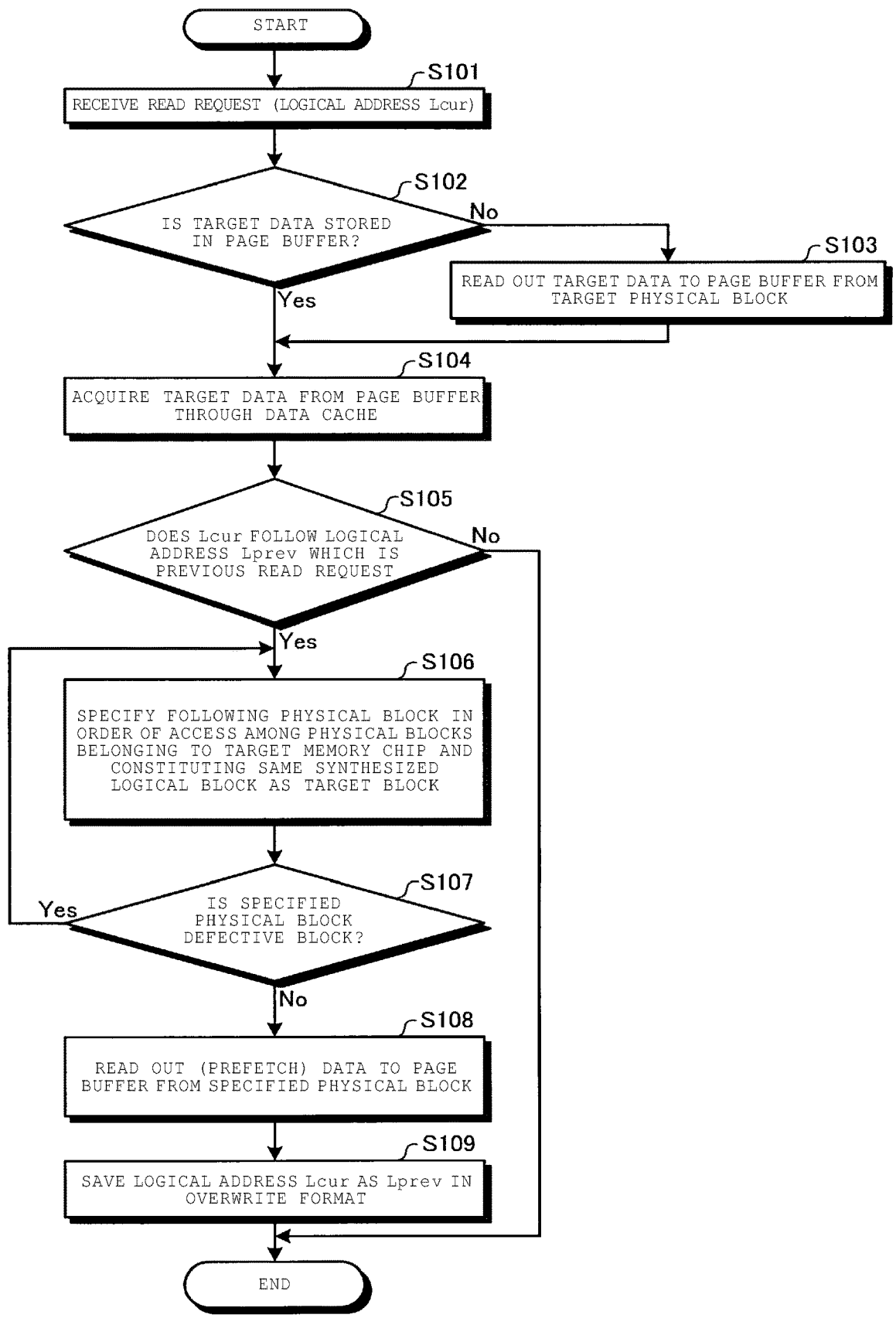
FIG. 12 is a flow chart illustrating the operation of the memory system according to the first embodiment.

Next, the operation of the memory system 1 according to the first embodiment will be described. FIG. 12 is a flowchart illustrating the operation of the memory system 1 according to the first embodiment.

When the memory controller 10 receives a read request from the host 2 (S101), the memory controller 10 determines whether or not data (hereinafter, target data) requested in accordance with the read request is stored in the page buffer 23 of the memory chip 21 (hereinafter, a target memory chip 21) which stores the target data (S102).

In the target memory chip 21, the target data is stored in the page buffer 23 when the target data has been prefetched, and the target data is not stored in the page buffer 23 when the target data has not been prefetched.

Meanwhile, a logical address for designating an access destination which is included in the read request received in S101 is denoted by Lcur. In addition, a bank to which the target memory chip 21 belongs is denoted by a target bank. In addition, the physical block 25 storing the target data is denoted by a target physical block 25.

In a case where the target data is not stored in the page buffer 23 (S102, No), the memory controller 10 causes the target memory chip 21 to read out the target data from the target physical block 25 to the page buffer 23 (S103).

In a case where the target data is stored in the page buffer 23 (S102, Yes) or after the process of S103, the memory controller 10 acquires the target data stored in the page buffer 23 through the data cache 22 (S104).

Subsequently, it is determined whether or not the logical address Lcur follows a logical address Lprev included in the read request which was received from the host 2 at the previous time (S105).

The process of S105 is an example of a process of determining whether or not the read request received in S101 corresponds to an access pattern of sequential reading. In a case where the logical address Lcur does not follow the logical address Lprev (S105, No), the memory controller 10 determines that the received read request does not correspond to the access pattern of sequential reading, and terminates the reading operation. In a case where the logical address Lcur follows the logical address Lprev (S105, Yes), the memory controller 10 determines that the received read request corresponds to the access pattern of sequential reading, and executes prefetching in the subsequent process.

A method of determining whether or not the received read request corresponds to the access pattern of sequential reading is not limited to only the above-described method. In another example, the memory controller 10 may determine that the read request received in S101 corresponds to the access pattern of sequential reading in a case where the logical address Lprev follows a logical address Lprev1 included in the read request which was received from the host 2 the time before last and where the logical address Lcur follows the logical address Lprev, and may determine that the read request received in S101 does not correspond to the access pattern of sequential reading in the other cases.

Meanwhile, in the example of FIG. 12, the memory controller 10 determines whether or not the access pattern from the host 2 corresponds to the sequential reading, but the determination is optional. The memory controller 10 may execute the prefetching regardless of the access pattern from the host 2.

In a case where the logical address Lcur follows the logical address Lprev (S105, Yes), the memory controller 10 specifies a following physical block 25 in order of access among N2 physical blocks 25 corresponding to a logical block belonging to the target memory chip 21 and belonging to the same synthesized logical block as the target block, by referring to the synthesized logical block configuration information 132 and the logical block configuration information 131 (S106).

Subsequently, the memory controller 10 determines whether or not the specified physical block 25 is a defective block by referring to the defective block information 133 (S107). In a case where the specified physical block 25 is a defective block (S107, Yes), the memory controller 10 performs the process of S106 again to further specify a physical block 25 following the physical block 25 which is the specified defective block.

For example, in the cases illustrated in FIGS. 4, 5, and 6, when BLOCK #A is a target block, the memory controller 10 specifies BLOCK #C by the first process of S106. In a case where BLOCK #C is a defective block, the memory controller 10 specifies BLOCK #A by the second process of S106.

In a case where the specified physical block 25 is not a defective block (S107, No), the memory controller 10 causes the target memory chip 21 to read out data from the following physical block 25 to the page buffer 23 (S108).

In this manner, the memory controller 10 sequentially searches for physical blocks 25 following a physical block 25 to be focused in the order of access. In a case where the physical block 25 which is not a defective block is found, the physical block 25 is specified as a physical block 25 to be prefetched.

Meanwhile, the memory controller 10 may set the physical block 25 following the target physical block 25 in the order of access as the physical block 25 to be prefetched, regardless of whether or not the physical block 25 following the target physical block 25 in the order of access is a defective block.

Subsequently to the process of S108, the memory controller 10 saves the logical address Lcur as the logical address Lprev in an overwrite format (S109), and terminates the reading operation.

As described above, a case where the number N1 of physical blocks 25 constituting one logical block is "2" and the number N2 of logical blocks constituting one synthesized logical block is "2" has been described. N1 may be "1" or may be "3" or greater. In addition, N2 may be "3" or greater.

In the above description, the memory chips 21 respectively belonging to different banks correspond to parallel operation elements, respectively. The parallel operation element is not limited to an example of each element realizing the parallel operation of bank interleaving.

Figure 13:
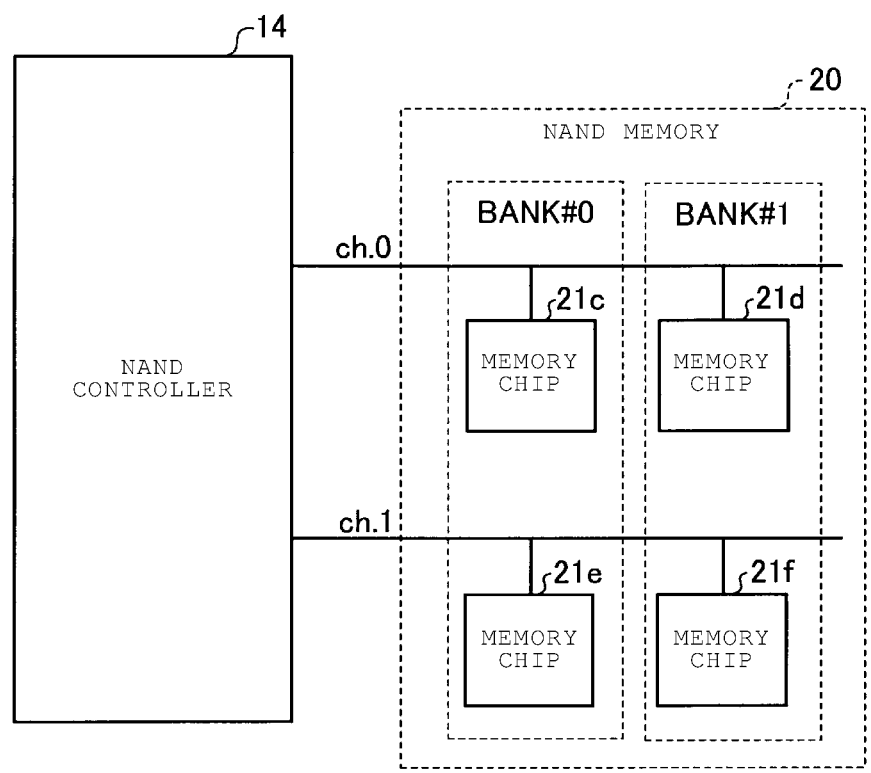
FIG. 13 is a diagram illustrating an example of another configuration of the memory system according to the first embodiment.

FIG. 13 is a diagram illustrating an example of another configuration of the memory system 1 according to the first embodiment. The same components as those illustrated in FIG. 1 are not shown in the drawing. According to the example of FIG. 13, the memory system 1 includes four memory chips 21, two memory chips 21*c* and 21*d* among the four memory chips are connected to one channel (ch.0), and the other two memory chips 21*e* and 21*f* are connected to the other channel (ch.1). The memory controller 10 can independently control two channels. That is, the memory controller 10 can operate the two memory chips 21*c* and 21*d* connected to ch.0 and the two memory chips 21*e* and 21*f* connected to ch.1 in parallel. In a case where the memory controller 10 controls two channels in parallel and operates two banks in parallel by bank interleaving, the memory controller can operate a total of four memory chips 21*c*, 21*d*, 21*e*, and 21*f* in parallel. That is, each of the four memory chips 21*c*, 21*d*, 21*e*, and 21*f* connected to different channels or belonging to different banks corresponds to a parallel operation element.

Figure 14:
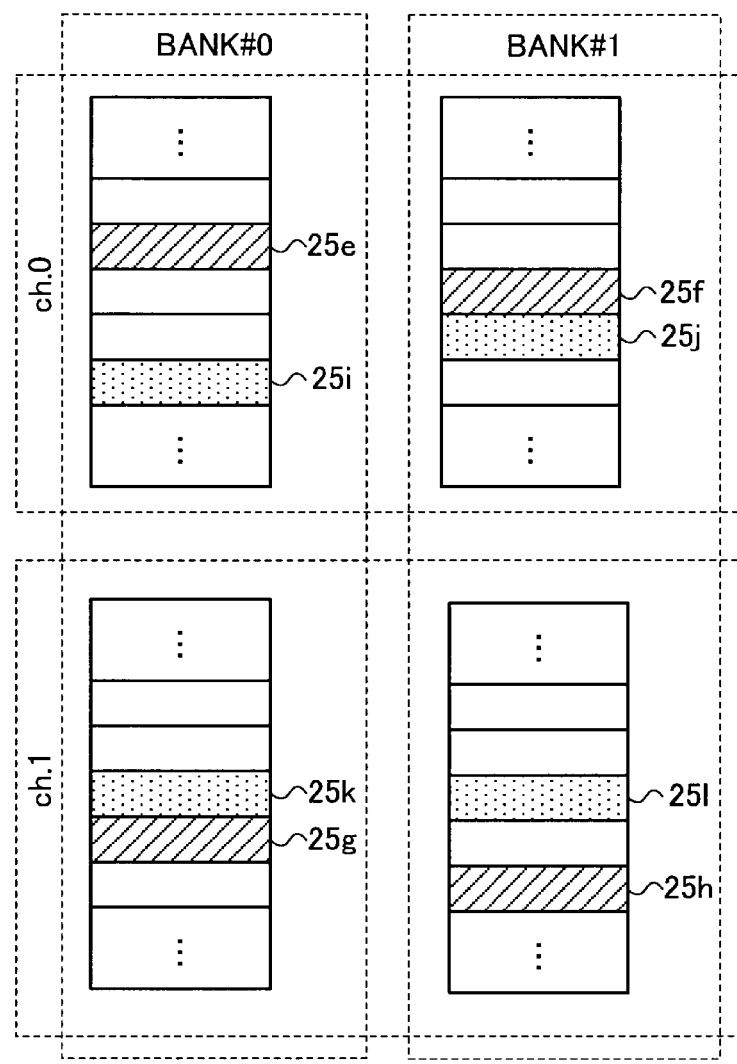
FIG. 14 is a diagram illustrating an example of another configuration of the synthesized logical block according to the first embodiment.

FIG. 14 is a diagram illustrating an example of another configuration of a synthesized logical block according to the first embodiment. A configuration of the synthesized logical block illustrated in this drawing corresponds to the configuration of FIG. 13. As illustrated in FIG. 14, four physical blocks 25*e*, 25*f*, 25*g*, and 25*h* constitute one logical block, and another four physical blocks 25*i*, 25*j*, 25*k*, and 25*l* constitute another logical block. The logical block configured with the physical blocks 25*e*, 25*f*, 25*g*, and 25*h* and the logical block configured with the physical blocks 25*i*, 25*j*, 25*k*, and 25*l* constitute one synthesized logical block. According to this example, N1 is "4", N2 is "2", and a frame of error correction has data of 8 pages. That is, in a case where the memory system 1 includes a plurality of channels, a frame is constituted across the plurality of channels.

As described above, according to the first embodiment, the memory system 1 includes N1 parallel operation elements, and each parallel operation element (in more detail, the memory chips 21 constituting each parallel operation element) includes the memory cell array 24 including the plurality of physical blocks 25, and the data cache 22 and the page buffer as buffers. The memory controller 10 constructs a synthesized logical block including at least N2 physical blocks 25 included in one parallel operation element. The memory controller 10 prefetches data to the page buffer 23 from a certain physical block 25 among N2 physical blocks 25 included in one parallel operation element in accordance with the acquisition of data requested by the host 2 from another physical block among the N2 physical blocks 25 included in one parallel operation element.

For example, in a case where data is written while changing a physical block which is a writing destination among N1*N2 physical blocks 25 constituting the synthesized logical block, if data stored in a page that simply follows in page numbers in the same physical block 25 is prefetched, the prefetched data is less likely to be requested by a subsequent read request.

In the first embodiment, the memory controller 10 performs prefetching while switching the physical block 25 which is a read-out destination with respect to one parallel operation element, it is possible to prefetch data that may be requested in accordance with the subsequent read request in a case where data is written while changing a physical block which is a writing destination with respect to the N1*N2 physical blocks 25 constituting the synthesized logical block. That is, the efficiency of prefetching is improved.

Meanwhile, the memory controller 10 acquires data stored in the page buffer 23 in a case where data read out to the page buffer 23 through prefetching is requested by the host 2. Accordingly, the speed of a response to the read request from the host 2 is improved.

In addition, the memory controller 10 constructs one logical block with N1 physical blocks 25 belonging different parallel operation elements, and constructs one synthesized logical block with N2 logical blocks. A frame of error correction is constructed with data of N1*N2 pages, and the pieces of data of N1*N2 pages are stored in different physical blocks 25 among the N1*N2 physical blocks 25 belonging to the same synthesized logical block.

The size of the frame with respect to the size of a parity can be increased by increasing the value of N2, and thus it is possible to efficiently store data transmitted from the host 2.

In addition, the memory controller 10 stores the order of access with respect to N2 logical blocks constituting the same synthesized logical block. The memory controller 10 specifies a physical block 25 to be prefetched based on the order of access when the read-out of data is performed. Thereby, in a case where a plurality of pieces of data transmitted by an access pattern of sequential writing is requested to be read out in accordance with the access pattern of sequential reading, the data which is read out through prefetching can be transmitted to the host 2, and thus the speed of a response to the read request from the host 2 is improved.

In addition, the memory controller 10 stores information as to a defective physical block 25. The memory controller 10 sequentially searches for physical blocks 25 following the physical block 25 subjected to the read-out of data in the order of access in each parallel operation element. In a case where a physical block 25 which is not a defective block is found, the memory controller specifies the physical block 25 as the physical block 25 to be prefetched.

In an example, the memory controller 10 skips the defective block and writes data. The memory controller 10 excludes the defective block determined to be unusable from an object to be prefetched, and thus it is possible to prefetch data highly likely to be requested later even when the NAND memory 20 includes a defective block.

In addition, the memory controller 10 determines whether or not a pattern requested by the host 2 corresponds to sequential reading. The memory controller 10 executes prefetching in a case where the pattern requested by the host 2 corresponds to the sequential reading, and does not execute prefetching in a case where the pattern requested by the host 2 does not correspond to the sequential reading. Thereby, it is possible to prefetch data highly likely to be requested in accordance with the subsequent read request.

Meanwhile, in recent years, a technique for simultaneously having access to a plurality of physical blocks 25 included in one memory chip 21 is known.

Figure 15:
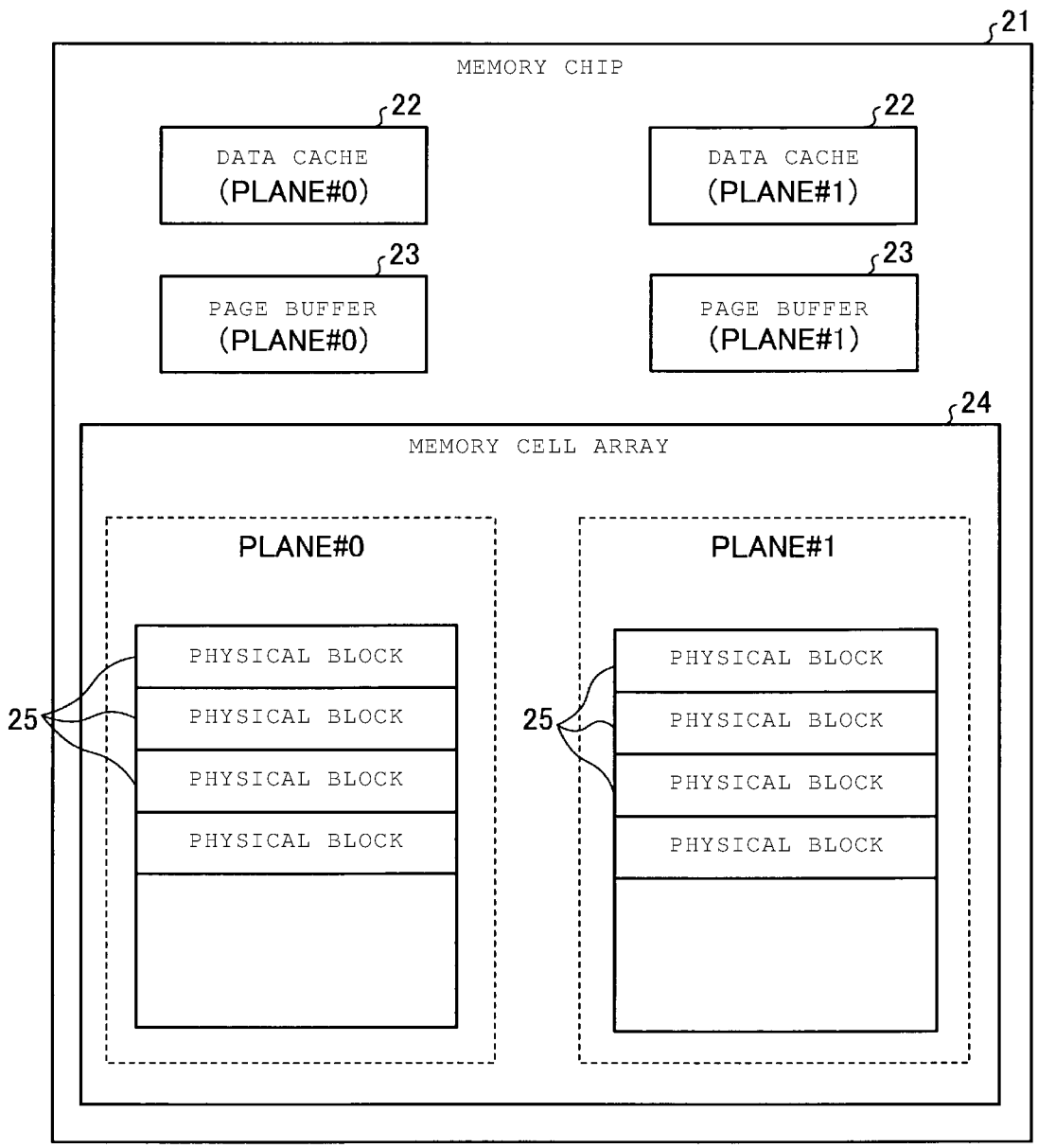
FIG. 15 is a diagram illustrating an example of another configuration of the memory chip according to the first embodiment.

FIG. 15 is a diagram illustrating an example of another configuration of the memory chip 21 according to the first embodiment. According to the example in this drawing, the memory cell array 24 is divided into two planes (PLANE #0, PLANE #1). Each plane includes a plurality of physical blocks 25. Each plane includes peripheral circuits (a row decoder, a column decoder, the page buffer 23, the data cache 22, and the like) which are independent of each other, and thus it is possible to execute erasing, programming, and reading on the two planes. Therefore, each of the four memory cell arrays 24 connected to different channels, belonging to different banks, or belonging to different plane numbers corresponds to a parallel operation element.

Figure 16:
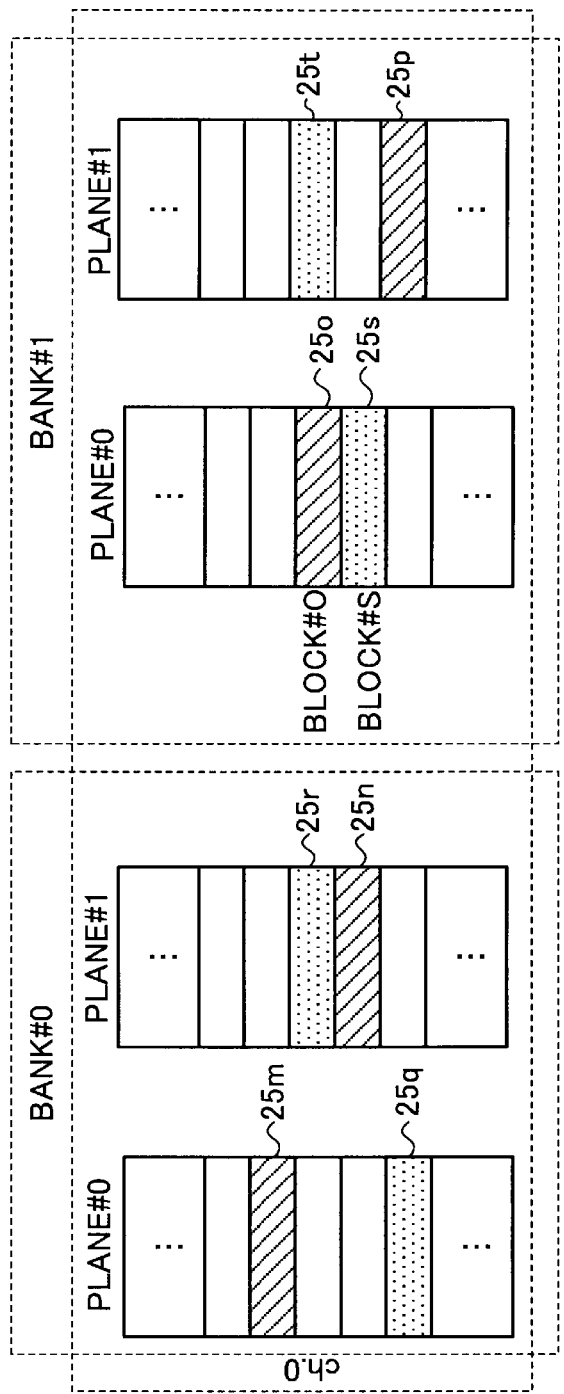
FIG. 16 is a diagram illustrating an example of still another configuration of the synthesized logical block according to the first embodiment.

FIG. 16 is a diagram illustrating an example of still another configuration of a synthesized logical block according to the first embodiment. A configuration of the synthesized logical block illustrated in this drawing corresponds to the configuration of FIG. 15. As illustrated in FIG. 16, four physical blocks 25m, 25n, 25o, and 25p for which the planes and the banks to which the physical blocks belong are different from each other constitute one logical block, and the other four physical blocks 25q, 25r, 25s, and 25t for which the planes and the banks to which the physical blocks belong are different from each other constitute another logical block. The logical block configured with the physical blocks 25m, 25n, 25o, and 25p and the logical block configured with the physical blocks 25q, 25r, 25s, and 25t constitute one synthesized logical block. According to this example, N1 is "4", N2 is "2", and a frame of error correction has data of 8 pages. That is, in a case where the memory chip 21 includes a plurality of planes, a frame is constituted across the plurality of planes.

At the time of executing prefetching on one memory chip 21, the memory controller 10 specifies two physical blocks 25 that belong to a logical block whose access order follows a target logical block, and that belong to different planes respectively. The memory controller 10 reads out pieces of data in parallel from the two physical blocks 25 to the page buffer 23 in a case where each of the specified two physical blocks 25 is not a defective block. In a case where any one of the two physical blocks 25 corresponds to a defective block, the memory controller 10 reads out data from only the physical block 25 that does not correspond to a defective block, out of the two physical blocks 25.

Meanwhile, the number of planes included in one memory chip 21 is not limited to "2". One memory chip 21 may include "3" or more planes.

In this manner, in prefetching, the memory controller 10 simultaneously reads out pieces of data from the physical blocks 25 that do not correspond to a defective block, out of the plurality of physical blocks 25 that belong to a logical block whose access order follows a target logical block, and that belong to different planes respectively. Accordingly, the technique according to the first embodiment can be applied even when the memory chip 21 is configured to include a plurality of planes as a plurality of parallel operation elements.

Second Embodiment

Figure 17:
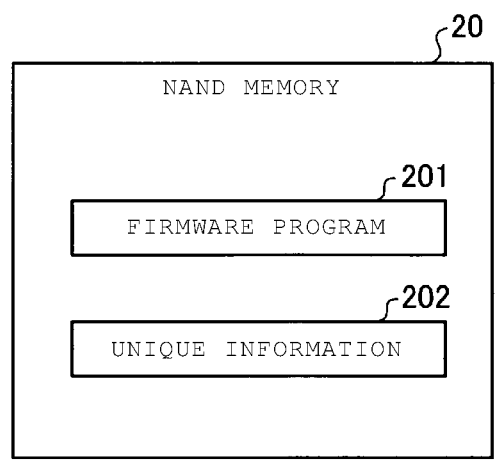
FIG. 17 is a diagram illustrating an example of data stored in a NAND memory according to a second embodiment.

FIG. 17 is a diagram illustrating an example of data stored in a NAND memory 20 according to a second embodiment.

As illustrated in the drawing, the NAND memory 20 stores a firmware program 201 and unique information 202.

The unique information 202 is information for deriving at least N2.

In one example, the number of pages of data constituting a frame is set in the firmware program 201. A manufacturer records the number of banks included in a memory system 1, the number of channels, and the number of planes included in each memory chip 21 as unique information when manufacturing the memory system 1. The memory controller 10 multiplies the number of banks included in the memory system 1, the number of channels, and the number of planes included in each memory chip 21 by each other, which are recorded in the unique information 202, based on the firmware program 201 to thereby calculate the number N1 of physical blocks 25 constituting one logical block. The memory controller 10 determines N2 by dividing the number of pages of data constituting a frame by N1.

A timing at which N2 is determined is not limited to a specific timing. In an example, the memory controller 10 determines N2 with reference to the unique information 202 during the start-up thereof. Thereafter, the memory controller 10 constructs a plurality of synthesized logical blocks each of which has N2 logical blocks.

Meanwhile, the unique information 202 may be N2 recorded as it is. In this case, the firmware program 201 can acquire N2 with reference to the unique information 202.

In this manner, N2 is configured to be variable, and thus the manufacturer can apply the same firmware program 201 to a plurality of memory systems 1 having different parallel operation elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory including a plurality of blocks, each of the plurality of blocks being a unit of a data erase operation, the plurality of blocks including at least first, second, third, fourth, and fifth blocks,
   a controller configured to:
   manage a first logical block that includes the first and fourth blocks, and a second logical block that includes the third and fifth blocks;
   manage a first synthesized logical block that includes the first and second logical blocks;
   access a first parallel-access element and a second parallel-access element in parallel, the first parallel-access element including the first and third blocks, the second parallel-access element including the fourth and fifth blocks;
   write a plurality of data units into the first synthesized logical block, the plurality of data units including a first data unit written in the first block, a third data unit written in the third block, a fourth data unit written in the fourth block, and a fifth data unit written in the fifth block, wherein the first data unit, the third data unit, the fourth data unit, and the fifth data unit form a first error correction frame; and
   manage an order of the writing of the plurality of data units into the first synthesized logical block.

2. The memory system according to claim 1, wherein the first parallel-access element further includes the second block, and
   the controller is configured to manage management data indicating that the second block is to be written to after the first block is written to.

3. The memory system according to claim 2, wherein the nonvolatile memory includes a first memory chip, the first memory chip including a first buffer, the first block, and the second block, and
   in response to a first read command received from a host, the controller
   instructs the nonvolatile memory to read the first data unit from the first block and to output the first data unit to the controller via the first buffer, and
   on the basis of the management data, instructs the nonvolatile memory to read a second data unit from the second block and to store the second data unit into the first buffer.

4. The memory system according to claim 3, wherein the controller is further configured to:
   in response to a second read command received from the host, instruct the nonvolatile memory to output the second data unit to the controller from the first buffer.

5. The memory system according to claim 4, wherein when the controller receives the first read command from the host after receiving a third read command from the host, and the third read command and the first read command are sequential reads, the controller instructs the nonvolatile memory to read the second data unit from the second block before receiving the second read command.

6. The memory system according to claim 2, wherein the first parallel-access element is a first bank, and the second parallel-access element is a second bank.

7. The memory system according to claim 6, wherein the controller is further configured to:
   write the third data unit into the third block after writing the first data unit into the first block and before writing the second data unit into the second block;
   write the fourth data unit into the fourth block in parallel with writing the first data unit into the first block; and
   write the fifth data unit into the fifth block in parallel with writing the third data unit into the third block, wherein
   the second data unit is a part of a second error correction frame.

8. The memory system according to claim 7, wherein the nonvolatile memory includes a first memory chip, the first memory chip including a first buffer, the first block, the second block, and the third block, and the management data further indicates that the second block is to be written to after the third block is written to, and
   in response to a first read command received from a host, the controller
   instructs the nonvolatile memory to read the first data unit, which is a part of the first error correction frame, from the first block and to output the first data unit to the controller via the first buffer, and
   on the basis of the management data, instructs the nonvolatile memory to read the third data unit, which is also a part of the first error correction frame, from the third block and to store the third data unit into the first buffer.

9. The memory system according to claim 8, wherein
in response to a second read command received from the host, the controller
instructs the nonvolatile memory to output the third data unit, which is a part of the first error correction frame, to the controller from the first buffer, and
on the basis of the management data, instructs the nonvolatile memory to read the second data unit, which is a part of the second error correction frame, from the second block and to store the second data unit into the first buffer.

10. The memory system according to claim 1, wherein the nonvolatile memory is a NAND-type flash memory and each of the data units has a size equal to a page.

11. A method of managing a nonvolatile memory including a plurality of blocks by a controller of the nonvolatile memory, wherein each of the plurality of blocks is a unit of a data erase operation and the plurality of blocks include at least first, second, third, fourth, and fifth blocks, said method comprising:
managing a first logical block that includes the first and fourth blocks, and a second logical block that includes the third and fifth blocks;
managing a first synthesized logical block that includes the first and second logical blocks;
accessing a first parallel-access element and a second parallel-access element in parallel, the first parallel-access element including the first and third blocks, the second parallel-access element including the fourth and fifth blocks;
writing a plurality of data units into the first synthesized logical block, the plurality of data units including a first data unit written in the first block, a third data unit written in the third block, a fourth data unit written in the fourth block, and a fifth data unit written in the fifth block, wherein the first data unit, the third data unit, the fourth data unit, and the fifth data unit form a first error correction frame; and
managing an order of the writing of the plurality of data units into the first synthesized logical block.

12. The method according to claim 11, wherein
the first parallel-access element further includes the second block, and
said managing is carried out in accordance with management data indicating that the second block is to be written to after the first block is written to.

13. The method according to claim 12, wherein the nonvolatile memory includes a first memory chip, the first memory chip including a first buffer, the first block, and the second block, said method further comprising:
in response to a first read command received from a host, instructing the nonvolatile memory to read the first data unit from the first block and to output the first data unit to the controller via the first buffer, and
on the basis of the management data, instructing the nonvolatile memory to read a second data unit from the second block and to store the second data unit into the first buffer.

14. The method according to claim 13, further comprising:
in response to a second read command received from the host, instructing the nonvolatile memory to output the second data unit to the controller from the first buffer.

15. The method according to claim 14, further comprising:
upon receiving the first read command from the host after receiving a third read command from the host, and the third read command and the first read command are sequential reads, instructing the nonvolatile memory to read the second data unit from the second block before receiving the second read command.

16. The method according to claim 12, wherein the first parallel-access element is a first bank, and the second parallel-access element is a second bank.

17. The method according to claim 16, further comprising:
writing the third data unit into the third block after writing the first data unit into the first block and before writing the second data unit into the second storage region block;
writing the fourth data unit into the fourth block in parallel with writing the first data unit into the first block; and
writing the fifth data unit into the fifth block in parallel with writing the third data unit into the third block, wherein
the second data unit is a part of a second error correction frame.

18. The method according to claim 17, wherein
the nonvolatile memory includes a first memory chip, the first memory chip including a first buffer, the first block, the second block, and the third block, and the management data further indicates that the second block is to be written to after the third block is written to, said method further comprising:
in response to a first read command received from a host, instructing the nonvolatile memory to read the first data unit, which is a part of the first error correction frame, from the first block and to output the first data unit to the controller via the first buffer, and
on the basis of the management data, instructing the nonvolatile memory to read the third data unit, which is also a part of the first error correction frame, from the third block and to store the third data unit into the first buffer.

19. The method according to claim 18, further comprising:
in response to a second read command received from the host,
instructing the nonvolatile memory to output the third data unit, which is a part of the first error correction frame, to the controller from the first buffer, and
on the basis of the management data, instructing the nonvolatile memory to read the second data unit, which is a part of the second error correction frame, from the second block and to store the second data unit into the first buffer.

20. The method according to claim 11, wherein the nonvolatile memory is a NAND-type flash memory and each of the data units has a size equal to a page.

* * * * *

UNITED STATES PATENT AND TRADEMARK OFFICE
CERTIFICATE OF CORRECTION

PATENT NO. : 11,301,387 B2
APPLICATION NO. : 16/704555
DATED : April 12, 2022
INVENTOR(S) : Hirokazu Takeuchi et al.

It is certified that error appears in the above-identified patent and that said Letters Patent is hereby corrected as shown below:

In the Claims

Column 16, Line 20, Claim 17 delete "storage region".

Signed and Sealed this
Twenty-second Day of November, 2022

Katherine Kelly Vidal
*Director of the United States Patent and Trademark Office*